United States Patent
Kobayashi

(10) Patent No.: US 9,348,218 B2
(45) Date of Patent: May 24, 2016

(54) MASK CLEANER AND CLEANING METHOD

(71) Applicant: KABUSHIKI KAISHA TOSHIBA, Minato-ku, Tokyo (JP)

(72) Inventor: Yoshihito Kobayashi, Hino (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 426 days.

(21) Appl. No.: 13/922,294

(22) Filed: Jun. 20, 2013

(65) Prior Publication Data

US 2014/0158157 A1    Jun. 12, 2014

(30) Foreign Application Priority Data

Dec. 12, 2012   (JP) .................................. 2012-271201

(51) Int. Cl.
*B08B 3/00*   (2006.01)
*G03F 1/82*   (2012.01)

(52) U.S. Cl.
CPC ........................................ *G03F 1/82* (2013.01)

(58) Field of Classification Search
None
See application file for complete search history.

(56) References Cited

U.S. PATENT DOCUMENTS

| 2004/0111823 | A1 | 6/2004 | Blattner et al. |
| 2011/0159440 | A1 | 6/2011 | Nakajima et al. |
| 2012/0024318 | A1 | 2/2012 | Itoh et al. |

FOREIGN PATENT DOCUMENTS

| JP | 6-260464 | 9/1994 |
| JP | 2004-152843 | 5/2004 |
| JP | 2004-327485 | 11/2004 |
| WO | WO 2004/011161 | 2/2004 |

*Primary Examiner* — Eric Golightly

(74) *Attorney, Agent, or Firm* — Finnegan, Henderson, Farabow, Garrett & Dunner, LLP

(57) ABSTRACT

According to one embodiment, a mask cleaner includes a cleaner support casing having a major surface with a recess formed therein, another major surface, and a gas supply hole and a gas exhaust hole extending through the cleaner support casing between the another major surface and the recess, a sticky layer support board attached to the cleaner support casing to block an opening of the recess of the cleaner support casing, and a sticky layer attached to a surface of the sticky layer support board remote from the cleaner support casing.

15 Claims, 4 Drawing Sheets

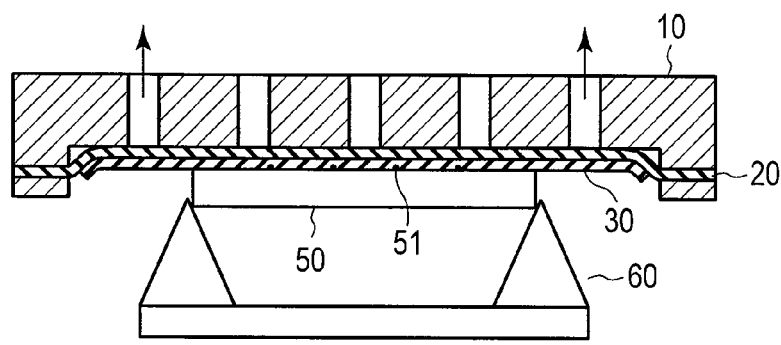
F I G. 2D
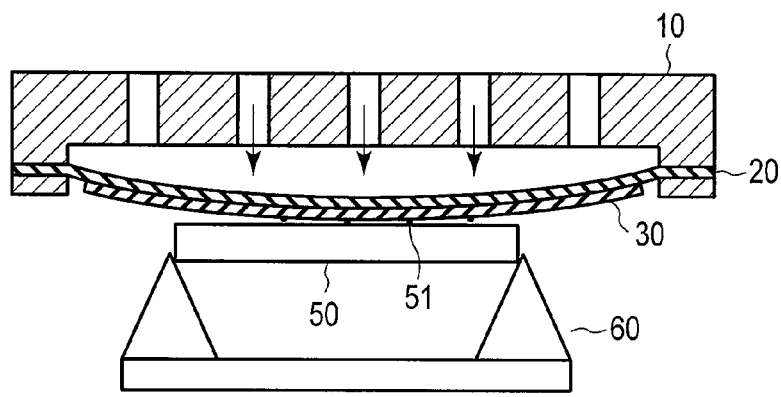
F I G. 2E
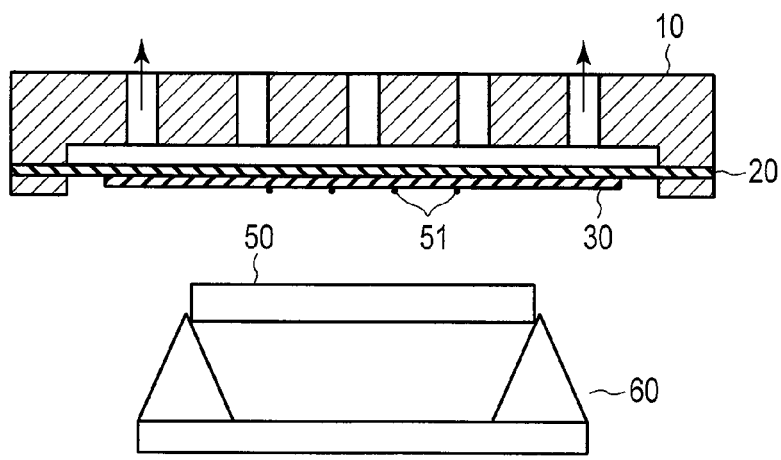
F I G. 2F

MASK CLEANER AND CLEANING METHOD

CROSS-REFERENCE TO RELATED APPLICATIONS

This application is based upon and claims the benefit of priority from Japanese Patent Application No. 2012-271201, filed Dec. 12, 2012, the entire contents of which are incorporated herein by reference.

FIELD

Embodiments described herein relate generally to a mask cleaner and a cleaning method for cleaning an exposure mask.

BACKGROUND

In photomasks (reticles) used for transferring a semiconductor device pattern, a transparent film called a pellicle is stuck to a pattern forming surface so as to protect the pattern. After exposure using a reticle is repeated, particles are stuck to the reticle. Therefore, it is necessary to wash the surface of the reticle using a drug solution in order to remove the particles. At this time, if the drug solution or moisture is stuck to the pellicle, the transmissivity of ultraviolet rays will vary, which makes it difficult to perform appropriate exposure. To avoid this, it is necessary to remove the pellicle when cleaning the reticle, and a new pellicle must be attached after the cleaning.

The process of peeling off the pellicle and that of reattaching a new pellicle may damage the pattern. In view of this, it is necessary to perform a pattern securing test. Thus, a long time is required until cleaning of the reticle is completed, and the reticle cannot be used for exposure during the long cleaning period. Further, the cost for pellicles is a factor of increasing the entire semiconductor manufacturing cost.

Furthermore, in EUV lithography, a vacuum chuck cannot be used as a chuck mechanism for an EUV mask, and an electrostatic chuck is employed instead. If a foreign particle is held between the surface of the chuck mechanism and the EUV mask, the mask will be deformed, thereby distorting the patterned surface.

Therefore, it is important to manage foreign particles by performing a foreign particle test for the chuck surface of the EUV mask, and when foreign particles are detected, it is eliminated by, for example, cleaning. However, if elimination by cleaning is performed, foreign particles may be reattached to the patterned surface. In this case, it is also necessary to perform, for example, a foreign particle test for the patterned surface, which requires a lot of time. As a result, the operating rate of the EUV exposure apparatus will lower.

BRIEF DESCRIPTION OF THE DRAWINGS

FIGS. 2A to 2F are cross sectional views useful in explaining a cleaning method using the reticle cleaner shown in FIG. 1.

DETAILED DESCRIPTION

In general, according to one embodiment, a mask cleaner comprises: a cleaner support casing having a major surface with a recess formed therein, another major surface, and a gas supply hole and a gas exhaust hole extending through the cleaner support casing between the another major surface and the recess; a sticky layer support board attached to the cleaner support casing to block an opening of the recess of the cleaner support casing; and a sticky layer attached to a surface of the sticky layer support board remote from the cleaner support casing.

Reticle cleaners and a cleaning method according to embodiments will be described with reference to the accompanying drawings.

First Embodiment

Figure 1:
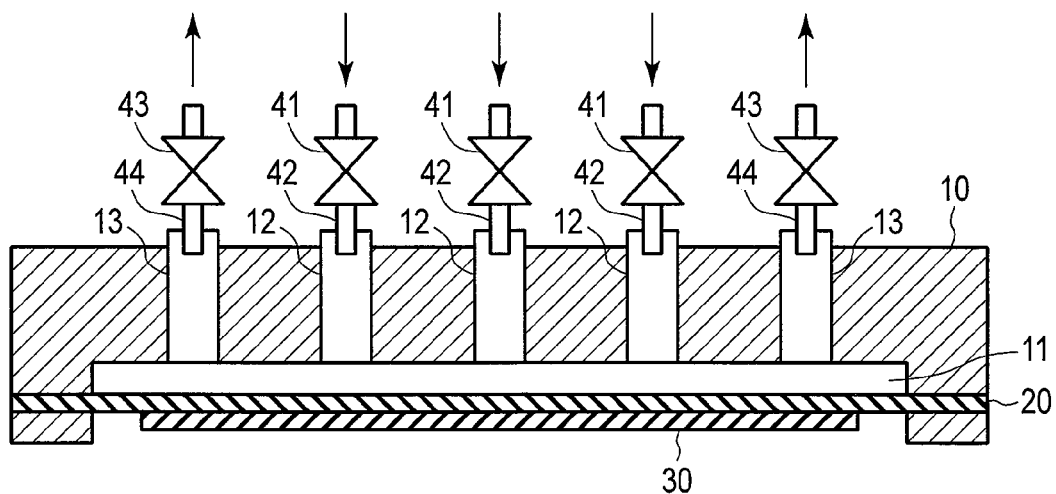
FIG. 1 is a schematic cross sectional view illustrating a reticle cleaner according to a first embodiment.

FIG. 1 is a schematic cross sectional view illustrating a reticle cleaner, in particular, a cleaner portion thereof, according to a first embodiment.

A sticky layer support board 20 is fixed to a cleaner support casing 10, and a sticky layer 30 is fixed to the sticky layer support board 20.

A major surface of the cleaner support casing 10 has a recess 11 in the portion thereof other than the peripheral portion. The sticky layer support board 20 is provided to block the opening of the recess 11. By virtue of the recess 11, a predetermined space is defined between the cleaner support casing 10 and the portion of the sticky layer support board 20 other than the fixing portion. Further, a plurality of gas supply holes 12 and gas exhaust holes 13 are formed through the cleaner support casing 10 between the first-mentioned major surface and the other major surface of the cleaner support casing 10 to communicate with the recess 11. More specifically, the gas supply holes 12 are provided in the central portions of the cleaner support casing 10, and the gas exhaust holes 13 are provided in the peripheral portions of the cleaner support casing 10.

The gas supply holes 12 are connected to gas supply tubes 42 having gas supply valves 41. The gas exhaust holes 13 are connected to gas exhaust pipes 44 having gas exhaust valves 43. The gas supplied into the recess 11 of the cleaner support casing 10 is not particularly limited unless it degrades the cleaner support casing 10 and the sticky layer support board 20. For instance, nitrogen gas, dry air, helium gas, etc., can be used as the gas.

The material of the cleaner support casing 10 is not particularly limited. It is sufficient if the material is a flat and smooth material and will not easily be deformed. The material may be a metal, a resin, ceramic, etc.

The material of the sticky layer support board 20 is not particularly limited, if it can be formed into a flat and smooth sheet or film. For instance, it may be a conventionally known resin, such as polyvinyl chloride, polyethylene, polypropylene, polyester, ethylene-vinylalcohol, polyurethane, ionomer, polyamide, polyimide, and PET. These resins may be used as a molten mixture of a plurality of resins, or as a copolymer. Alternatively, the resins may be formed as a multi-layer structure of a plurality of resin layers.

It is desirable that the space defined between the cleaner support casing 10 and the sticky layer support board 20, i.e., the recess 11, should have a depth of 0.01 mm to 50 mm. Namely, the bottom of the recess 11 of the cleaner support casing 10 is formed flat, and the depth of the recess 11 from the opening to the bottom is desirably 0.01 mm to 50 mm. More practically, it is desirable that the depth of the recess 11 be, in particular, 0.5 mm to 20 mm.

When the sticky layer 30 and a reticle are tightly attached to each other, the sticky layer support board 20 can be deformed to expand at its central portion by supplying gas into the space (recess 11) between the cleaner support casing 10 and the sticky layer support board 20. As a result, the sticky layer 30 can be gradually attached to the reticle from the central portion to the peripheral portion. This prevents air bubbles, for example, from mixing during adhesion to thereby uniformly eliminate dust.

If the above-mentioned space is narrower than 0.01 mm, the sticky layer support board 20 cannot sufficiently be deformed when gas is supplied. In this case, air bubbles, for example, may be mixed when the reticle and the sticky layer 30 are tightly attached, which reduces the dust elimination performance. Further, if a foreign particle of a big size enters between the reticle and the layer 30, it may damage the reticle when the reticle and the sticky layer support board 20 are adhered to each other. In contrast, if the space is greater than 50 mm, the sticky layer support board 20 will be excessively deformed when the reticle and the sticky layer 30 are tightly attached, whereby the reticle and the sticky layer 30 cannot be uniformly adhered. As a result, the dust elimination effect may be reduced.

The size of the recess 11 formed in the cleaner support casing 10 is not particularly limited. It is sufficient if the central portion of the sticky layer support board 20 is expanded by supplying gas a clearance defined between the cleaner support casing 10 and the sticky layer support board 20 when the reticle and the sticky layer 30 are adhered to each other. Thus, the shape, size and position of the recess 11, the number of holes in the recess, etc., are not limited. However, it is preferable that gas supply holes should be formed in the central portion of the sticky layer region.

The sticky layer 30 is formed of an adhesive containing a (meta)acrylic ester polymer as a main component, or a urethane-, polyester-, epoxy-, polyvinyl chloride-, melanin-, polyimide- or silicone-based adhesive. As will be described in detail later, a conventional adhesive can be used as the material of the sticky layer 30 as long as it has an adhesion that can adhere thereto the foreign particles stuck to the reticle.

If necessary, the sticky layer 30 may contain various additive agents, such as an adhesion addition agent, a curing agent, a plasticizing agent, a polymerization forbidding agent and an antiaging agent.

The sticky layer 30 can be stacked on the sticky layer support board 20 in the following manner. For instance, the stacking can be realized by spin-coating the sticky layer support board 20 with the toluene ethyl acetate solution of an adhesive containing an acrylic ester copolymer as a main component and an isocyanate compound as a cross-linking agent. The sticky layer 30 can be formed on the sticky layer support board 20 by a conventional method, such as gravure coater, a comma coater, a bar coater, a knife coater, a roll coater, relief printing, intaglio printing, photographic printing, a flexographic printing, offset printing, screen printing, spray printing, etc. Further, the invention is not limited to a method of directly coating a sticky layer support board with an adhesive, but a method of transferring, to a sticky layer support board, an adhesive layer of a desired thickness beforehand coated on a separation film may be employed.

The thickness of the sticky layer 30 is 0.5 µm to 300 µm, and preferably, 2 µm to 30 µm. If the thickness is 0.5 µm or less and a foreign particle size is large, the reticle may be damaged by foreign particles when the reticle is adhered to the sticky layer support board 20. On the other hand, if the thickness is 300 µm or more, the peeling property between the reticle and the sticky layer 30 is reduced, whereby an adhesive may be adhered to the reticle.

It is sufficient if the sticky layer forming region exists in a reticle region to be cleaned. It is not always needed to form the sticky layer 30 over the entire surface of the sticky layer support board 20.

Referring then to FIGS. 2A to 2F, a description will be given of a cleaning method using the reticle cleaner of the embodiment.

Figure 2A:
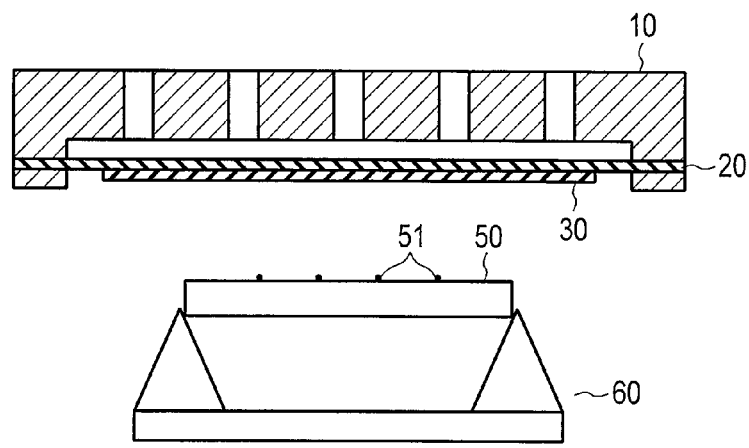

Firstly, as shown in FIG. 2A, a reticle stage 60 with a photomask (reticle) 50 placed thereon is conveyed to a position at which the reticle 50 and the sticky layer 30 of the reticle cleaner can be put into close contact with each other. A transparent film called a pellicle is adhered to the pattern forming surface of the reticle 50. The reticle 50 is placed on the reticle stage 60 with its pattern forming surface directed downward. The reticle 50 is movable horizontally and vertically in accordance with the movement of the stage 60.

Figure 2B:
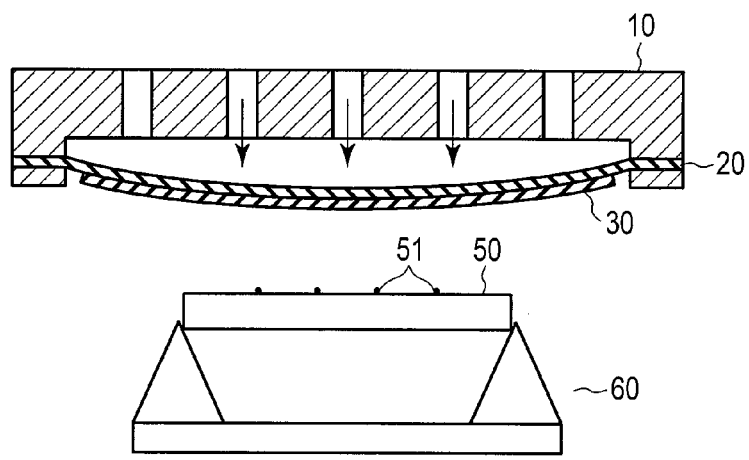

Subsequently, the gas supply valves 41 are opened to supply gas into the recess 11 of the cleaner support casing 10 as shown in FIG. 2B. As a result, the sticky layer support board 20 is deformed to expand the central portion thereof. At this time, the central portion of the sticky layer 30 is also downwardly curved.

Figure 2C:
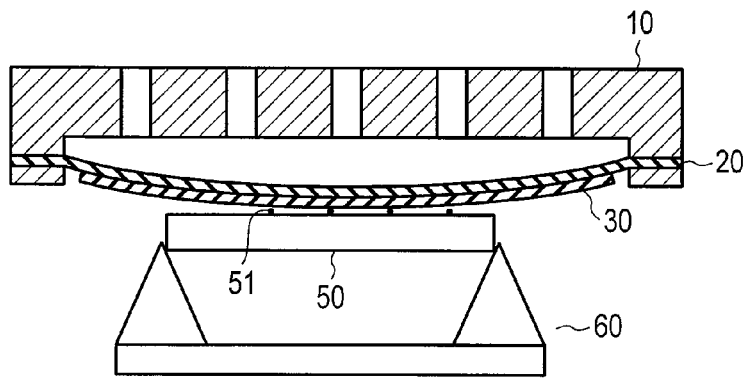

After that, as shown in FIG. 2C, the reticle stage 60 is upwardly moved to put the sticky layer 30 into close contact with the reticle 50. Since at this time, the central portion of the sticky layer support board 20 is downwardly curved, the sticky layer 30 is put into close contact with the central portion of the reticle 50.

Thereafter, the gas supply valves 41 are closed and the gas exhaust valves 43 are opened, thereby exhausting the recess 11 of the cleaner support casing 10. As a result, the deformation of the sticky layer support board 20 is reset to return the sticky layer 30 to a flat state, whereby the sticky layer 30 is uniformly put into close contact with the entire portion of one surface of the reticle. In this state, the particles 51 on the reticle 50 dent into and are caught by the sticky layer 30. At this time, the bottom of the recess 11 may be brought into contact with the sticky layer support board 20, and the sticky layer 30 be pressed against the reticle 50 as shown in FIG. 2D.

After the sticky layer 30 is kept in close contact with the reticle for a certain time, gas is supplied into the recess of the cleaner support casing 10 while the reticle stage 60 is being downwardly moved, as shown in FIG. 2E. As a result, the sticky layer support board 20 is again deformed to expand its central portion. At this time, the sticky layer 30 has its central portion downwardly curved, and is uniformly separated from the outer peripheral portion of the reticle 50. For the separation, no great force is needed since the sticky layer 30 is locally separated. Further, the particles 51 caught by the sticky layer 30 are separated from the reticle 50.

After that, as shown in FIG. 2F, the gas in the recess 11 of the cleaner support casing 10 is exhausted after the sticky layer 30 is separated from the reticle 50, thereby returning the sticky layer support board 20 to the flat state. The reticle 50 is then conveyed in accordance with the horizontal movement of the reticle stage 60.

As described above, the reticle cleaner of the first embodiment can clean the reticle 50 simply by bringing the sticky layer 30 into close contact with the reticle 50 and then separating them. Accordingly, unlike the case of cleaning using an agent solution, the particles 51 on the reticle 50 can be easily eliminated without peeling the pellicle. Thus, it is not necessary to coat another pellicle, and hence the manufacturing cost can be reduced. Further, the operating rate of an exposure apparatus using the reticle 50 can be enhanced.

Also, since the portions of the sticky layer 30 are sequentially put into close contact with the reticle 50, beginning with the central portion of the layer 30, instead of simultaneously bringing the entire sticky layer 30 into contact with the reticle 50, mixture of air bubbles can be suppressed when they are made contact with each other. This prevents particles 51 from being left on the reticle 50. In addition, the sticky layer 30 can be separated with a small force since it is separated beginning with its peripheral portion.

Second Embodiment

Figure 3:
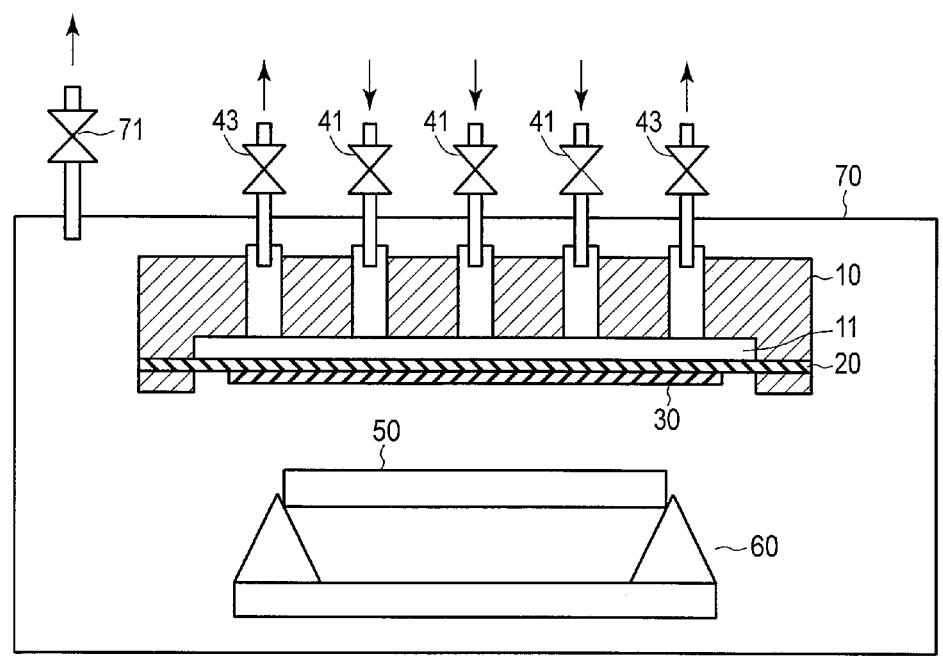
FIG. 3 is a schematic cross sectional view illustrating a reticle cleaner according to a second embodiment.

FIG. 3 is a cross sectional view schematically illustrating a reticle cleaner according to a second embodiment. In FIG. 3, elements similar to those shown in FIGS. 1 and 2 are denoted by corresponding reference numbers, and will not be described in detail.

In the second embodiment, the ambient atmosphere assumed when cleaning is performed is controlled. In the second embodiment, the reticle cleaner of FIG. 1, the reticle 50 and the reticle stage 60 are contained in a chamber 70. An exhaust pump, for example, is connected to the chamber 70, and the interior of the chamber 70 can be kept under vacuum pressure via a gas exhaust valve 71. The chamber 70 also contains a control mechanism for controlling temperature, humidity, etc., which can set the temperature and humidity in the chamber 70 to optimal values at which the surface of the reticle 50 is stabilized.

A method of cleaning the reticle in the cleaner of the second embodiment is basically the same as that employed in the first embodiment. However, the former differs from the latter in that in the former, the air in the chamber 70 is exhausted to make the interior of the chamber 70 under vacuum pressure, before the sticky layer 30 is made contact with the reticle 50. When the space in which the reticle 50 is placed is under vacuum pressure or negative pressure, air bubbles can be more reliably prevented from being left between the reticle 50 and the sticky layer 30 when they are made close contact with each other.

At this time, the degree of vacuum in the chamber 70 is desirably 10-2000 Pa, and more desirably, 10-100 Pa. If the degree of vacuum is less than 10 Pa, a long time may be required until the vacuum degree is reached, because of the air tightness of the cleaner and the capacity of, for example, the vacuum pump. In contrast, if the degree of vacuum exceeds 200 Pa, air bubbles cannot sufficiently be removed when the reticle and the sticky layer are made close contact.

If the interior of the chamber 70 is under vacuum pressure or negative pressure, it may be necessary to change the gas supply/exhaust methods of the first embodiment. To expand the central portion of the sticky layer support board 20, it is sufficient if the pressure in the recess 11 is made higher than the pressure in the chamber 70. To make the sticky layer support board 20 flat, it is sufficient if the pressure in the recess 11 is made equal to that in the chamber 70. The above pressure control can be realized using the gas supply valves 41 and the gas exhaust valves 43. Namely, by controlling the operation timing of the gas supply valves 41 and the gas exhaust valves 43, the same cleaning as in the first embodiment can be realized.

As described above, the second embodiment can provide the same advantage as in the first embodiment, and can also stabilize the surface of an adhesive by controlling the ambient atmosphere during cleaning to thereby stabilize the cleaning effect. Yet further, by exhausting the air between the reticle 50 and the sticky layer 30 of the reticle cleaner when they are made close contact with each other, mixture of air bubbles during the close contact can be more reliably suppressed.

Modification

The invention is not limited to the above-described embodiments.

In the embodiments, particles on the reverse side of a reticle are eliminated. However, particles on the obverse side may be eliminated. Further, regarding the relative movement of the reticle cleaner and the reticle stage, the invention is not limited to the movement of the reticle stage, but the reticle cleaner may be moved.

In the embodiments, particles on a photomask (reticle) used for transfer of a device pattern for semiconductor devices are eliminated. However, the invention is not limited to this, but is also applicable to elimination of particles on the chuck surface of an EUV mask. Also in the EUV mask, removal of particles without cleaning is free from a problem occurring in cleaning, such as re-attachment of particles to the patterned surface, thereby enhancing the working efficiency of an EUV exposure apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask cleaner comprising:
a cleaner support casing having a major surface with a recess formed therein, another major surface, and a gas supply hole and a gas exhaust hole extending through the cleaner support casing between the another major surface and the recess;
a flat sticky layer support board attached to the cleaner support casing to block an opening of the recess of the cleaner support casing; and
a sticky layer configured to be used for removal of particles on a surface of a mask, the sticky layer being attached to a surface of the sticky layer support board remote from the cleaner support casing.

2. The mask cleaner according to claim 1, further comprising a gas supply pipe provided with a gas supply valve and connected to the gas supply hole, and a gas exhaust pipe provided with a gas exhaust valve and connected to the gas exhaust hole.

3. The mask cleaner according to claim 1, wherein the recess has a flat bottom, and a clearance between the flat bottom of the recess and the sticky layer support board is set to 0.01 mm to 50 mm when no gas is supplied to the recess.

4. The mask cleaner according to claim 1, wherein the sticky layer has a thickness of 0.5 μm to 300 μm.

5. The mask cleaner according to claim 1, wherein the gas supply hole is formed in the recess at a central position, and the gas exhaust hole is formed in the recess at a peripheral position.

6. The mask cleaner according to claim 1, wherein the cleaner support casing, the sticky layer support board, the sticky layer, and a mask stage with the mask placed thereon are contained in a chamber capable of being exhausted under a vacuum pressure.

7. A mask cleaner comprising:
   a chamber containing a mask stage with a mask placed thereon;
   a cleaner support casing having a major surface with a recess formed therein, the cleaner support casing having a gas supply hole and a gas exhaust hole extending therethrough between another major surface and the recess;
   a gas supply pipe provided with a gas supply valve and connected to the gas supply hole;
   a gas exhaust pipe provided with a gas exhaust valve and connected to the gas exhaust hole;
   a flat sticky layer support board attached to the cleaner support casing to block an opening of the recess of the cleaner support casing; and
   a sticky layer configured to be used for removal of particles on a surface of a mask, the sticky layer being attached to a surface of the sticky layer support board remote from the cleaner support casing.

8. The mask cleaner according to claim 7, wherein the recess has a flat bottom, and a clearance between the flat bottom of the recess and the sticky layer support board is 0.01 mm to 50 mm when no gas is supplied to the recess.

9. The mask cleaner according to claim 7, wherein the sticky layer has a thickness of 0.5 μm to 300 μm.

10. The mask cleaner according to claim 7, wherein the gas supply hole is formed in the recess at a central position, and the gas exhaust hole is formed in the recess at a peripheral position.

11. The mask cleaner according to claim 7, further an exhaust pipe used to exhaust the chamber.

12. A cleaning method comprising:
   preparing a mask cleaner, the mask cleaner including: a cleaner support casing having a major surface with a recess formed therein, another major surface, and a gas supply hole and a gas exhaust hole extending through the cleaner support casing between the another major surface and the recess; a flat sticky layer support board attached to the cleaner support casing to block an opening of the recess of the cleaner support casing; and a sticky layer attached to a surface of the sticky layer support board remote from the cleaner support casing;
   supplying a gas into the recess through the gas supply hole to project a central portion of the sticky layer of the mask cleaner;
   bringing the projected portion of the sticky layer to a major surface of a mask;
   exhausting the gas in the recess through the gas exhaust hole to return the sticky layer to a flat state and put the sticky layer into close contact with the major surface of the mask; and
   supplying the gas into the recess through the gas supply hole to project the central portion of the sticky layer, and to separate the sticky layer from the major surface of the mask such that the mask is separated beginning with a peripheral portion thereof.

13. The cleaning method according to claim 12, wherein pressure in a clearance between the sticky layer and the mask is reduced before the sticky layer is put into contact with the major surface of the mask.

14. The cleaning method according to claim 12, wherein the bringing the projected portion of the sticky layer to the major surface of the mask includes pressing the sticky layer support board against the mask using a bottom of the recess of the cleaner support casing.

15. The cleaning method according to claim 12, wherein
   the bringing the projected portion of the sticky layer to the major surface of the mask includes returning the sticky layer to a flat state by the exhausting the gas, and at the same time making the sticky layer and the mask relatively close to each other; and
   the separating the sticky layer from the major surface of the mask includes projecting a central portion of the sticky layer by the supplying the gas, and at the same time making the sticky layer and the mask relatively be away from each other.

* * * * *